(12) United States Patent
Yu et al.

(10) Patent No.: US 8,422,237 B2
(45) Date of Patent: Apr. 16, 2013

(54) FOLDING STRUCTURE

(75) Inventors: Hong-Chi Yu, Kaohsiung (TW); Mao-Ting Chang, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 246 days.

(21) Appl. No.: 12/923,181

(22) Filed: Sep. 8, 2010

(65) Prior Publication Data

US 2012/0026672 A1 Feb. 2, 2012

(30) Foreign Application Priority Data

Jul. 29, 2010 (TW) .................................. 99125081 A

(51) Int. Cl.
*H05K 1/14* (2006.01)
(52) U.S. Cl.
USPC ............................ 361/737; 361/715; 361/755
(58) Field of Classification Search .................. 361/737, 361/715, 755; 439/79, 374, 379, 607, 610, 439/680
See application file for complete search history.

(56) References Cited

U.S. PATENT DOCUMENTS

| 6,624,005 | B1 * | 9/2003 | DiCaprio et al. | 438/113 |
| 7,296,098 | B2 * | 11/2007 | Shih | 710/13 |
| 7,447,037 | B2 * | 11/2008 | Hiew et al. | 361/737 |
| 2004/0034738 | A1 * | 2/2004 | Huang | 711/115 |
| 2006/0149895 | A1 * | 7/2006 | Pocrass | 711/103 |
| 2009/0248966 | A1 * | 10/2009 | Crandell | 711/103 |

* cited by examiner

*Primary Examiner* — Hung S Bui
(74) *Attorney, Agent, or Firm* — Bacon & Thomas, PLLC

(57) ABSTRACT

The present invention relates to a folding structure comprising a storage device with an electronic component at least and a plurality of metal contacts and is configured with electronic component(s), metal contacts, and a plug board or a folding kit to embody the present invention's space effectively used and saved, match the present product's design requirements for lightness, thinness, shortness, and smallness, and integrate with other relevant products to become a combinational product with both multiple functions and its shape advantageous to lightness, thinness, shortness, and smallness.

3 Claims, 7 Drawing Sheets

FOLDING STRUCTURE

BACKGROUND OF THE INVENTION

1) Field of the Invention

The present invention relates to a folding structure, especially to a foldable linking structure used in multiple data transfer interfaces.

2) Description of the Prior Art

In development of the electronic industry, the data transfer interface and the non-volatile memory (flash memory) are combined to portable data storage devices available to all users recently, particularly the flash disk (USB flash drive) extensively applicable. In general, a flash disk comprises a USB plug used to be plugged into an electronic product's USB port for data accessed or stored in compliance with the internationally confessed USB (Universal Serial Bus) connector protocol in which the USB transfer interface provides a user excellent convenience, extensibility and high-speed transfer for data access and is extensively applied to various electronic devices, peripheral devices, information appliances (IA), or 3C consumable electronic products.

Referring to FIG. 1 that demonstrates a flash disk (50) manufactured with the prior arts comprises a USB plug (51) and a strip body (52) connected behind wherein the strip body (52) incorporates multiple electronic components such as flash memory device, controller device, and passive device accommodated on a substrate and the USB plug (51) is welded on a printed circuit board.

However, in view of restrictions of the USB plug (51) and the rear strip body (52), this type of flash disk (50) manufactured with the prior arts deserves to be further improved under lightness, thinness, shortness, and smallness required in present electronic devices.

On the other hand, a flash disk (50) manufactured with the prior arts is hard to combine with other relevant products due to the large volume of both a USB plug (51) and a rear strip body (52) and is short of advantages of a combinational product's lightness, thinness, shortness, and smallness under a multi-functional requirement.

SUMMARY OF THE INVENTION

Against this background, the present invention as one device to solve the said problems is intended for supplying a folding structure which makes space effectively used and saved, matches a present product's design requirements for lightness, thinness, shortness, and smallness, and integrates with other relevant products to become a combinational product with both multiple functions and its shape advantageous to lightness, thinness, shortness, and smallness.

Through the following techniques to reach the said purposes, the present invention of a folding structure comprises:

A storage device and a plug board wherein the storage device has both a substrate with an inner surface on which an electronic component at least and a plurality of contact pieces electrically connecting each other through the substrate are installed and an electronics body which encases the electronic component and accommodates a plurality of metal contacts on its outer surface electrically connected to the substrate as well as partially corresponding to the electronic component; furthermore, the plug board has its outer surface provided with a plurality of metal contacts and is coupled to one side of the storage device wherein the metal contacts are electrically connected to the contact pieces and combines with the metal contacts on the electronics body's outer surface for compatibility of a data transfer interface.

The purposes of the present invention and solutions for its technical problems are further embodied with the following techniques.

The said folding structure has the metal contacts compatible to one of the following data transfer interfaces at least such as Universal Serial Bus (USB), Mini Universal Serial Bus (Mini USB), Micro Universal Serial Bus (Micro USB), or External Serial Advanced Technology Attachment (e-SATA).

The said folding structure has the plug board and the storage device linked with a pin structure.

The said folding structure has the electronic component comprising a memory chip and a control chip at least.

The purposes of the present invention and solutions for its technical problems embodied with the following techniques make a folding structure comprise:

A storage device and a folding kit wherein the storage device has a substrate with an inner surface on which an electronic component at least and a plurality of contact pieces electrically connecting each other through the substrate are installed; furthermore, the folding kit installed on the storage device has a first folding section with a plurality of metal contacts electrically connected to the substrate and a second folding section with a plurality of metal contacts electrically connected to the contact pieces; in detail, the electronic component is installed to partially correspond to the metal contacts; the metal contacts are compatible to a data transfer interface.

The purposes of the present invention and solutions for its technical problems are also further embodied with the following techniques.

The said folding structure has the substrate's inner surface formed to be an electronics body encasing the electronic components.

The said folding structure has the metal contacts compatible to one of the following data transfer interfaces at least such as Universal Serial Bus (USB), Mini Universal Serial Bus (Mini USB), Micro Universal Serial Bus (Micro USB), or External Serial Advanced Technology Attachment (e-SATA).

The said folding structure has the first folding section and the second folding section linked with a pin structure.

The said folding structure has the electronic component comprising a memory chip and a control chip at least.

In contrast to the prior arts, the present invention is effective in space efficaciously used and saved, so as to match a present product's design requirements for lightness, thinness, shortness, and smallness and integrate with other relevant products to become a combinational product with both multiple functions and its shape advantageous to lightness, thinness, shortness, and smallness

BRIEF DESCRIPTIONS OF THE DRAWINGS

DETAILED DESCRIPTIONS OF THE PREFERRED EMBODIMENTS

Figure 1:
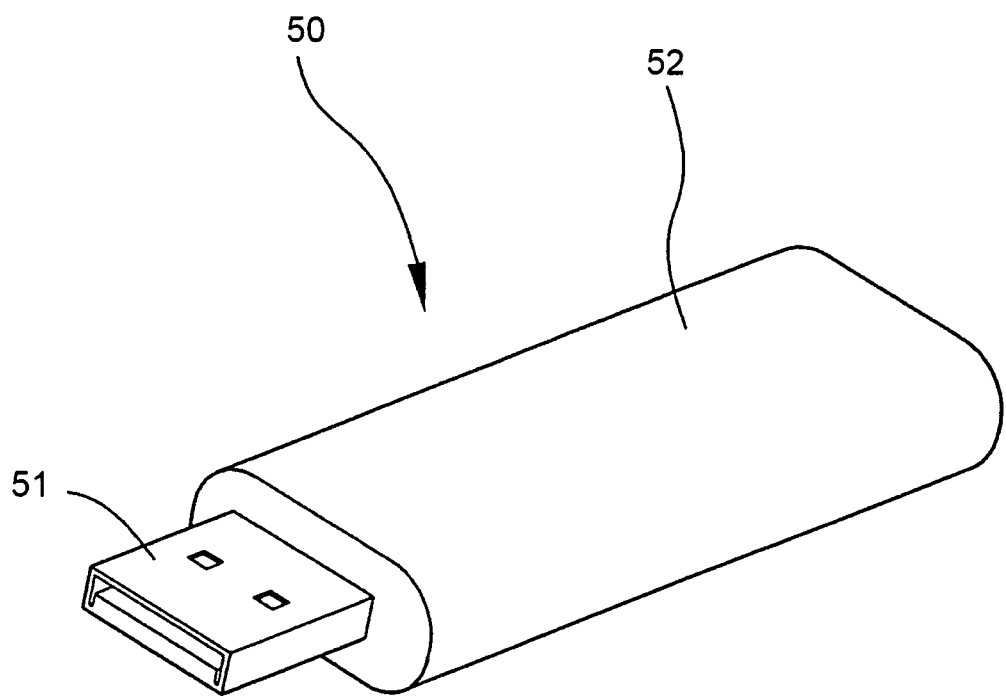
FIG. 1 is the general schematic diagram of a flash disk manufactured with the prior arts.
Figure 2:
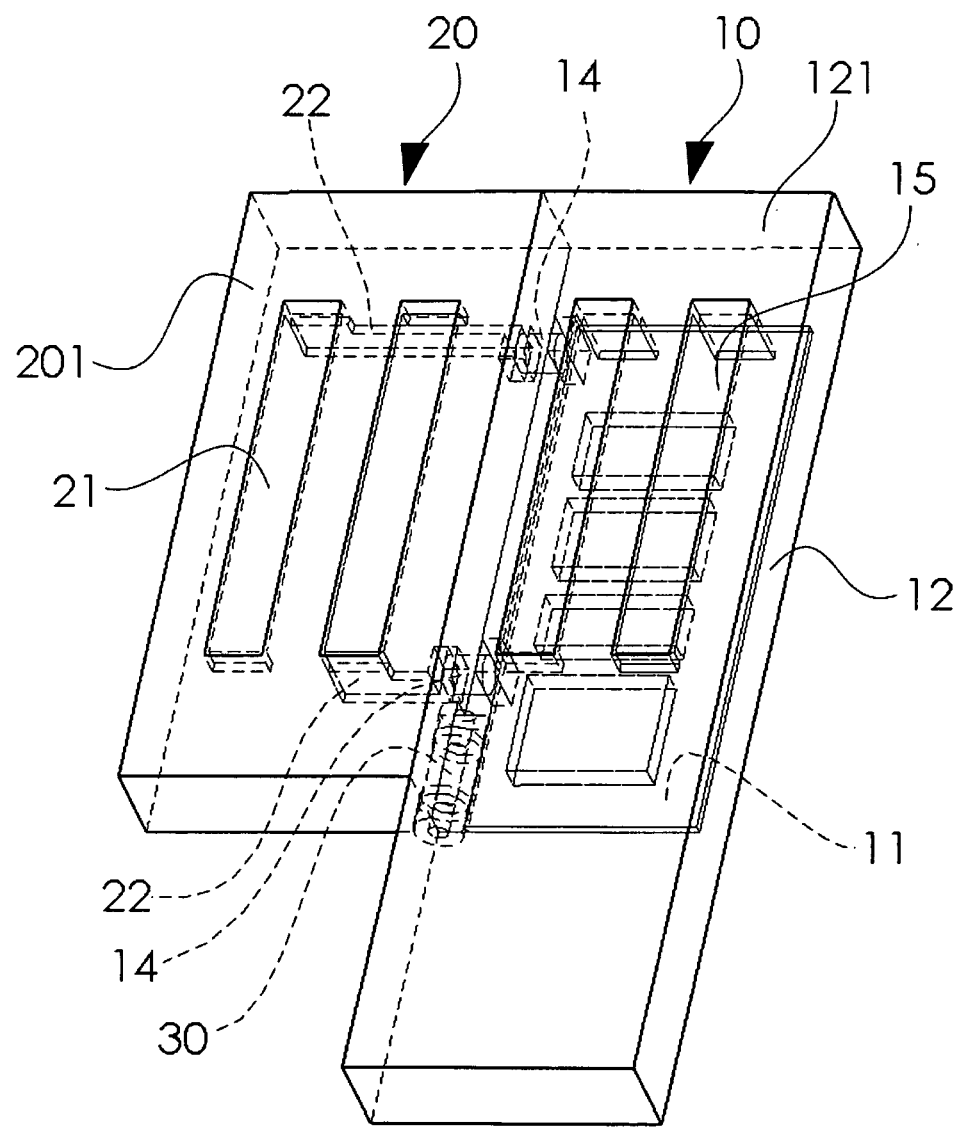
FIG. 2 is the perspective view for the first embodiment of the present invention.
Figure 3:
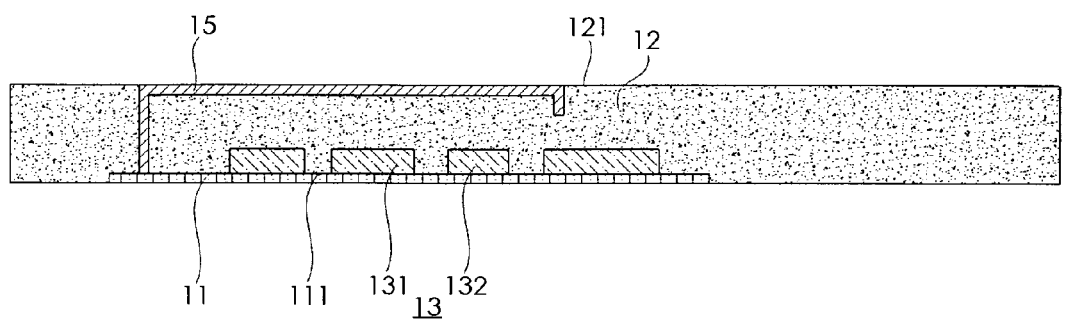
FIG. 3 is the first sectional view for the first embodiment of the present invention.
Figure 4:
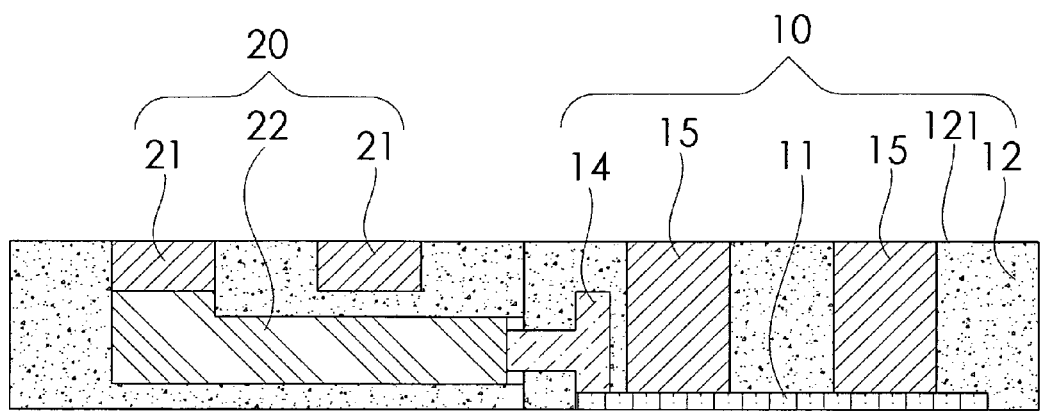
FIG. 4 is the second sectional view for the first embodiment of the present invention.

For purposes, characteristics, and effects obviously and easily understood, the preferred embodiments of the present invention are particularly interpreted as follows:

FIGS. 2, 3 and 4 demonstrate the first embodiment of the present invention of a folding structure comprising a storage device (10) and a plug board (20) wherein the storage device (10) has both an electronics body (12) and a substrate (11) accommodating an inner surface (111) on which an electronic component (13) at least electrically connected to the substrate (11) via a wire bonding or a flip chip technique and a plurality of contact pieces (14) are installed. In detail, the electronic component (13) comprises a memory chip (131) and a control chip (132) at least and is electrically connected to the contact pieces (14) via the substrate (11), and the electronics body (12) encases the electronic component (13) and is made of a polymeric material such as epoxy compound preferably.

Referring to FIG. 3 that demonstrates the electronics body (12) has an outer surface (121) provided with a plurality of metal contacts (15) and electrically connected to the substrate (11). Furthermore, the electronic component (13) is installed to partially correspond to the metal contacts (15) for a storage device's space effectively used and saved.

Then referring to FIGS. 2 and 4 that demonstrate the plug board (20) provided with a plurality of metal contacts (21) on an outer surface (201) is coupled to one side of the storage device (10) in this preferable manner including but not limited to a pin structure (30), a clasp, or an adhesive.

Concretely speaking, the metal contacts (21) installed on the plug board (20) and electrically connected to contact pieces (14) are electrically connected to the contact pieces (14) via a connection piece (22) and further the substrate (11) via the contact pieces (14) preferably wherein the metal contacts (21) and the connection piece (22) belong to an integrated structure. In addition, the metal contacts (21) on the plug board (20) combine with metal contacts (15) on an outer surface (121) of the electronics body (12) for compatibility of data transfer interfaces. Preferably, the metal contacts (15, 21) are compatible to one of the following data transfer interfaces at least such as Universal Serial Bus (USB) (as one example described in the embodiment), Mini Universal Serial Bus (Mini USB), Micro Universal Serial Bus (Micro USB), or External Serial Advanced Technology Attachment (e-SATA). Referring to FIG. 3 simultaneously that demonstrates one configuration of the electronic component (13) and metal contacts (15) via connection of the storage device (10) and the plug board (20) embodies the present invention with space effectively used and saved, matches a present product's design requirements for lightness, thinness, shortness, and smallness and integrates with other relevant products to become a combinational product with both multiple functions and its shape advantageous to lightness, thinness, shortness, and smallness.

Figure 5:
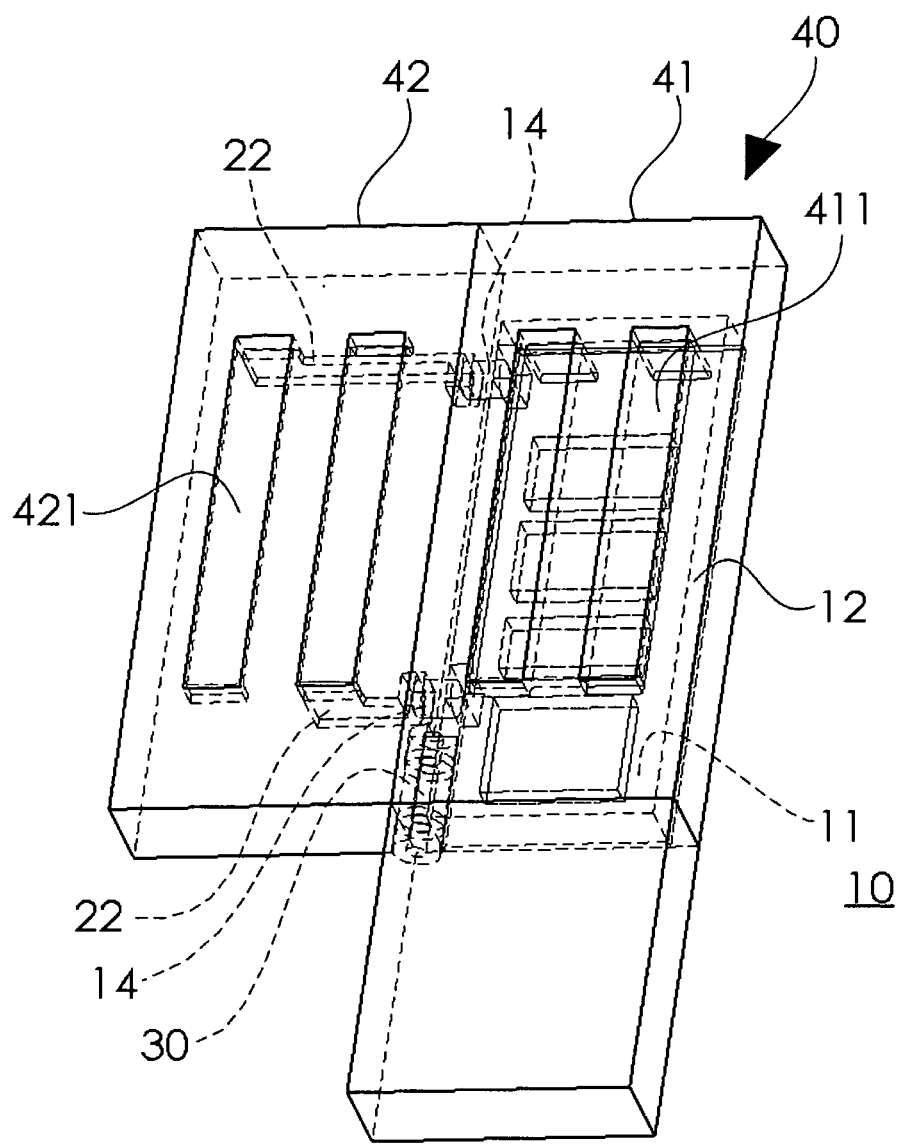
FIG. 5 is the perspective view for the second embodiment of the present invention.
Figure 6:
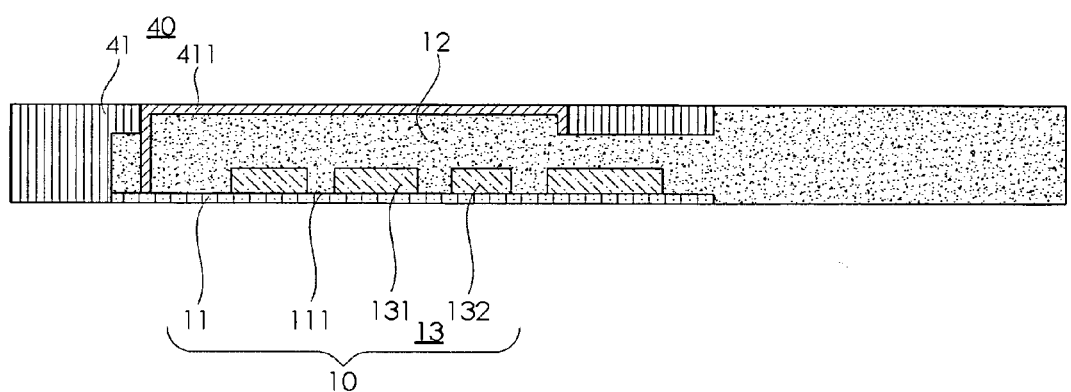
FIG. 6 is the first sectional view for the second embodiment of the present invention.
Figure 7:
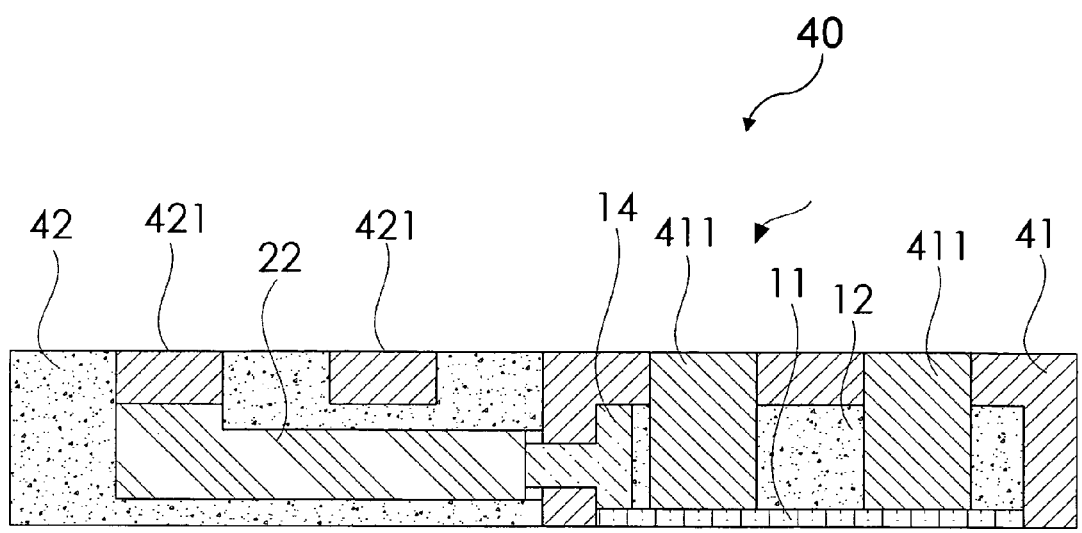
FIG. 7 is the second sectional view for the second embodiment of the present invention.

Referring to FIGS. 5, 6 and 7 that demonstrate the second embodiment of the present invention with similar components in the first embodiment of a folding structure shown in FIGS. 2, 3 and 4 and the same symbols marked in FIGS. 5, 6 and 7 and not mentioned here.

Referring to FIGS. 5 and 6 first that demonstrate the second embodiment of a folding structure comprising: a storage device (10) and a folding kit (40) wherein the storage device (10) has a substrate (11) with an inner surface (111) on which an electronic component (13) at least and a plurality of contact pieces (14) are installed and the electronic components (13) are electrically connected to the substrate (11) by a wire bonding or a flip chip technique. In detail, the electronic component (13) comprises a memory chip (131) and a control chip (132) at least. Additionally, the electronic component (13) is electrically connected to contact pieces (14) through the substrate (11).

Preferably, the inner surface (111) on the substrate (11) forms an electronics body (12) encasing the electronic components (13) and made of a polymeric material such as epoxy compound.

Further referring to FIGS. 5 and 7 that demonstrate the folding kit (40) comprising a first folding section (41) and a second folding section (42) wherein the outer surface of the first folding section (41) and the outer surface of the second folding section (42) are provided with a plurality of metal contacts (411) electrically connected to the substrate (11) and a plurality of metal contacts (421) electrically connected to the contact pieces (14), respectively. Preferably, the metal contacts (421) are electrically connected to the contact pieces (14) via a connection piece (22) and then the substrate (11) via the contact pieces (14) wherein the metal contacts (421) as well as the connection piece (22) belong to an integrated structure. Additionally, the coupling of the first folding section (41) and the second folding section (42) includes but is not limited to a pin structure (30), a clasp, or an adhesive.

Referring to FIG. 6 that demonstrates an electronic component (13) is installed to partially correspond to the metal contacts (411) for space of the present invention effectively used and saved.

Further referring to FIGS. 5 and 7 that demonstrate metal contacts (411, 421) compatible to a data transfer interface. Preferably, the metal contacts (411, 421) are compatible to one of the following data transfer interfaces at least such as Universal Serial Bus (USB) (as one example described in the embodiment), Mini Universal Serial Bus (Mini USB), Micro Universal Serial Bus (Micro USB), or External Serial Advanced Technology Attachment (e-SATA).

Furthermore, the folding kit (40) is installed into the storage device (10). Despite the USB transfer interface described in this embodiment as shown in FIGS. 5, 6 and 7 only, a practical implementation is not limited to this way and therefore any equivalent change in the instruction, claims, or drawings of the present invention does not depart from claims of the present invention so that another folding kit (40) with an alternative data transfer interface for this embodiment under a user's requirements is further installed to the storage device (10) for an effect of a flexible application and cost saving. In addition, the present invention with the folding kit (40) and the storage device (10) installed as well as a configuration of an electronic component (13) and metal contacts (411) has space effectively used and saved, matches a present product's design requirements for lightness, thinness, shortness, and smallness, and integrates with other relevant products to become a combinational product with both multiple functions and its shape advantageous to lightness, thinness, shortness, and smallness.

Therefore, the present invention that is different from general conventional flash disks but regarded as creative work meets patentability and is applied for the patent.

The foregoing disclosure and description are illustrative and explanatory of preferred embodiments only and therefore any equivalent change in the instruction, claims, or drawings of the present invention does not depart from claims of the present invention.

What is claimed is:

1. A folding structure comprising:

A storage device (10) has both a substrate (11) with an inner surface (111) on which an electronic component (13) at least and a plurality of contact pieces (14) electrically connected each other via the substrate (11) are installed and an electronics body (12) encasing the electronic component (13) wherein the electronics body (12) has an outer surface (121) with a plurality of metal contacts (15) provided and electrically connected to the substrate (11) and the electronic component (13) is installed to partially correspond to the metal contacts (15) for the storage device's space effectively used and saved;

A plug board (20) has its outer surface (201) with a plurality of metal contacts (21) provided and is coupled to one side of the storage device (10) wherein the metal contacts (21) on the plug board (20) are electrically connected to the contact pieces (14);

wherein the metal contacts (21) on the plug board (20) combine with metal contacts (15) on an outer surface (121) of the electronics body (12) for compatibility of the Universal Serial Bus (USB) data transfer interfaces.

2. The folding structure according to claim 1 wherein the plug board (20) is linked to the storage device (10) via a pin structure (30).

3. The folding structure according to claim 1 wherein the electronic component (13) comprises a memory chip (131) and a control chip (132) at least.

* * * * *